United States Patent
Mears et al.

(10) Patent No.: US 10,109,479 B1
(45) Date of Patent: Oct. 23, 2018

(54) METHOD OF MAKING A SEMICONDUCTOR DEVICE WITH A BURIED INSULATING LAYER FORMED BY ANNEALING A SUPERLATTICE

(71) Applicant: ATOMERA INCORPORATED, Los Gatos, CA (US)

(72) Inventors: Robert J. Mears, Wellesley, MA (US); Robert John Stephenson, Duxford (GB); Keith Doran Weeks, Chandler, AZ (US); Nyles Wynn Cody, Tempe, AZ (US); Marek Hytha, Brookline, MA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 15/664,028

(22) Filed: Jul. 31, 2017

(51) Int. Cl.
*H01L 21/02* (2006.01)

(52) U.S. Cl.
CPC .... *H01L 21/02507* (2013.01); *H01L 21/0245* (2013.01); *H01L 21/02164* (2013.01); *H01L 21/02532* (2013.01); *H01L 21/02694* (2013.01)

(58) Field of Classification Search
CPC ......... H01L 21/02507; H01L 21/02499; H01L 21/02505
See application file for complete search history.

(56) References Cited

U.S. PATENT DOCUMENTS

| 4,843,439 | A | * | 6/1989 | Cheng | B82Y 20/00 257/19 |
| 4,937,204 | A | | 6/1990 | Ishibashi et al. | |
| 5,216,262 | A | | 6/1993 | Tsu | |
| 5,357,119 | A | | 10/1994 | Wang et al. | |
| 5,683,934 | A | | 11/1997 | Candelaria | |

(Continued)

FOREIGN PATENT DOCUMENTS

GB 2347520 6/2000

OTHER PUBLICATIONS

Catalano et al. "The composition and structure of SIPOS: A high spatial resolution electron microscopy study" J. Mater. Res., vol. 8, No. 11, Nov. 1993; pp. 2893-2901.

(Continued)

*Primary Examiner* — Julia Slutsker
(74) *Attorney, Agent, or Firm* — Allen, Dyer, Doppelt + Gilchrist, P.A. Attorneys at Law

(57) ABSTRACT

A method for making a semiconductor device may include forming a superlattice on a semiconductor substrate including a respective plurality of stacked groups of layers. Each group of layers may include a plurality of stacked base semiconductor monolayers defining a base semiconductor portion, and at least one non-semiconductor monolayer constrained within a crystal lattice of adjacent base semiconductor portions. Further, at least some semiconductor atoms from opposing base semiconductor portions may be chemically bound together through the at least one non-semiconductor monolayer therebetween. The method may further include epitaxially forming a semiconductor layer on the superlattice, and annealing the superlattice to form a buried insulating layer in which the at least some semiconductor atoms are no longer chemically bound together through the at least one non-semiconductor monolayer therebetween.

23 Claims, 8 Drawing Sheets

(56) References Cited

U.S. PATENT DOCUMENTS

| | | |
|---|---|---|
| 5,796,119 A | 8/1998 | Seabaugh |
| 6,141,361 A | 10/2000 | Mears et al. |
| 6,376,337 B1 | 4/2002 | Wang et al. |
| 6,472,655 B1 | 10/2002 | Takagi |
| 6,741,624 B2 | 5/2004 | Mears et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 9,275,996 B2 | 3/2016 | Mears et al. |
| 9,406,753 B2 | 8/2016 | Mears et al. |
| 9,558,939 B1 | 1/2017 | Stephenson et al. |
| 2002/0175347 A1* | 11/2002 | Herold ............... H01L 21/8258 257/195 |
| 2003/0034529 A1 | 2/2003 | Fitzgerald et al. |
| 2003/0057416 A1 | 3/2003 | Currie et al. |
| 2006/0220118 A1 | 10/2006 | Stephenson et al. |
| 2007/0012910 A1 | 1/2007 | Mears et al. |
| 2007/0020833 A1 | 1/2007 | Mears et al. |
| 2007/0197006 A1* | 8/2007 | Dukovski ........... H01L 21/0237 438/483 |
| 2008/0012004 A1 | 1/2008 | Huang et al. |
| 2008/0258134 A1 | 10/2008 | Mears et al. |
| 2009/0200538 A1* | 8/2009 | Sasaki ................... B82Y 20/00 257/14 |
| 2011/0215299 A1 | 9/2011 | Rao |
| 2015/0357414 A1 | 12/2015 | Mears |
| 2016/0099317 A1 | 4/2016 | Mears et al. |
| 2016/0149023 A1 | 5/2016 | Mears et al. |
| 2016/0336406 A1 | 11/2016 | Mears et al. |
| 2016/0336407 A1 | 11/2016 | Mears et al. |
| 2016/0358773 A1 | 12/2016 | Mears et al. |
| 2017/0294514 A1 | 10/2017 | Mears |

OTHER PUBLICATIONS

U.S. Appl. No. 15/633,918, filed Jun. 27, 2017.
U.S. Appl. No. 15/670,231, filed Aug. 7, 2017.
U.S. Appl. No. 15/610,240, filed Aug. 7, 2017.
U.S. Appl. No. 15/670,266, filed Aug. 7, 2017.
U.S. Appl. No. 15/670,274, filed Aug. 7, 2017.
U.S. Appl. No. 15/678,616, filed Aug. 16, 2017.
U.S. Appl. No. 15/678,658, filed Aug. 16, 2017.
Luo et al, "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by Insertion of partial Monolayers of oxygen" IEEE silicon Nanoelectronics Workshop (2012): (Date of conference Jun. 10-11, 2012) pp. 2.
Novikov et al. "Silicon-based Optoelectronics" 1999-2003, pp. 1-6.
R. Tsu Phenomena in silicon nanostructure device published online Sep. 6, 2000 by Applied Physics and Materials Science & Processing, pp. 391-402.
Raphael Tsu "Si Based Green ELD: Si-Oxygen Superlattice" wysiwyg:// l/http://www3.interscience.wiley.com/cgi-bin/abstract/72512946/ start: published online Jul. 21, 2000; 2 pgs. Abstract Only.
U.S. Appl. No. 15/592,464, filed May 11, 2017.
Xu et al "Effectiveness of Quasi-confinement technology for improving P-chanel Si an Ge MOSSFET performance" Department of Electrical Engineering and Computer Science, University of California, Berkeley, 2012. pp. 2. mearstech.net; retrieved from interact Jan. 18, 2016.
Xu et al. "Extension of planar bulk n-channel MOSFET scaling with oxygen insertion technology" IEEE Transactions on Electron devices, vol. 61, No. 9; Sep. 2014. pp. 3345-3349.
Xu et al., "MOSFET performance and scalability enhancement by insertion of oxygen layers", Department of Electrical Engineering and Computer Science, University of California, Berkeley, 2012, pp. 1-4.

* cited by examiner

METHOD OF MAKING A SEMICONDUCTOR DEVICE WITH A BURIED INSULATING LAYER FORMED BY ANNEALING A SUPERLATTICE

TECHNICAL FIELD

The present disclosure generally relates to semiconductor devices and, more particularly, to enhanced materials and fabrication techniques for semiconductor devices.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an re-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor processing techniques to provide insulating regions or layers in semiconductor devices.

SUMMARY

A method for making a semiconductor device may include forming a superlattice on a semiconductor substrate including a respective plurality of stacked groups of layers. Each group of layers may include a plurality of stacked base semiconductor monolayers defining a base semiconductor portion, and at least one non-semiconductor monolayer constrained within a crystal lattice of adjacent base semiconductor portions. Further, at least some semiconductor atoms from opposing base semiconductor portions may be chemically bound together through the at least one non-semiconductor monolayer therebetween. The method may further include epitaxially forming a semiconductor layer on the superlattice, and annealing the superlattice to form a buried insulating layer in which the at least some semiconductor atoms are no longer chemically bound together through the at least one non-semiconductor monolayer therebetween.

More particularly, the method may further include forming at least one active semiconductor device in the epitaxially formed semiconductor layer. By way of example, the annealing may take place at a temperature in a range of 800° C. to 1000° C. in an inert atmosphere, although other temperatures and atmospheres may also be used. Furthermore, the at least one non-semiconductor monolayer may be formed with a dosage of at least $2.5 \times 10^{14}$ atoms/cm$^3$, for example. Also by way of example, the superlattice may be formed with a spacing of less than or equal to 16 Å between non-semiconductor monolayers of adjacent groups of layers, although a wider spacing may also be used.

In accordance with one example embodiment, forming the superlattice may comprise selectively forming a plurality of spaced apart superlattices on the semiconductor substrate. In accordance with another example embodiment, forming the superlattice may comprise forming a continuous superlattice across the semiconductor substrate.

By way of example, the at least one non-semiconductor monolayer may comprise oxygen, and the semiconductor monolayers may comprise silicon and/or germanium.

DETAILED DESCRIPTION

Figure 1:
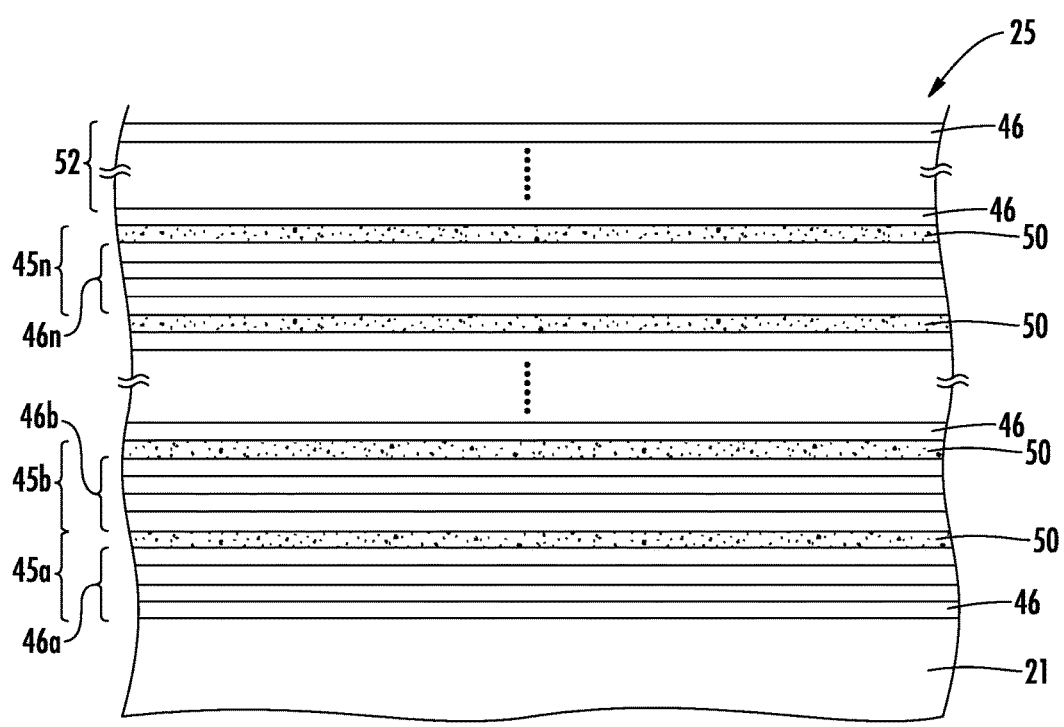
FIG. 1 is a greatly enlarged schematic cross-sectional view of a superlattice for use in a semiconductor device in accordance with the present invention.

The present disclosure will now be described more fully hereinafter with reference to the accompanying drawings, in which example embodiments are shown. However, many different forms may be implemented based upon the teachings set forth herein, and the disclosure should not be construed as limited to the specific example embodiments provided. Rather, these embodiments are provided so that this disclosure will be thorough and complete, and will fully convey the disclosed concepts to those skilled in the art. Like numbers refer to like elements throughout, and prime notation is used to indicate similar elements in different embodiments.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,i,j}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,i,j}^{-1}(E_F, T) = \frac{-\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the n$^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicants have identified improved materials or structures for use in semiconductor devices. More specifically, the Applicants have identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
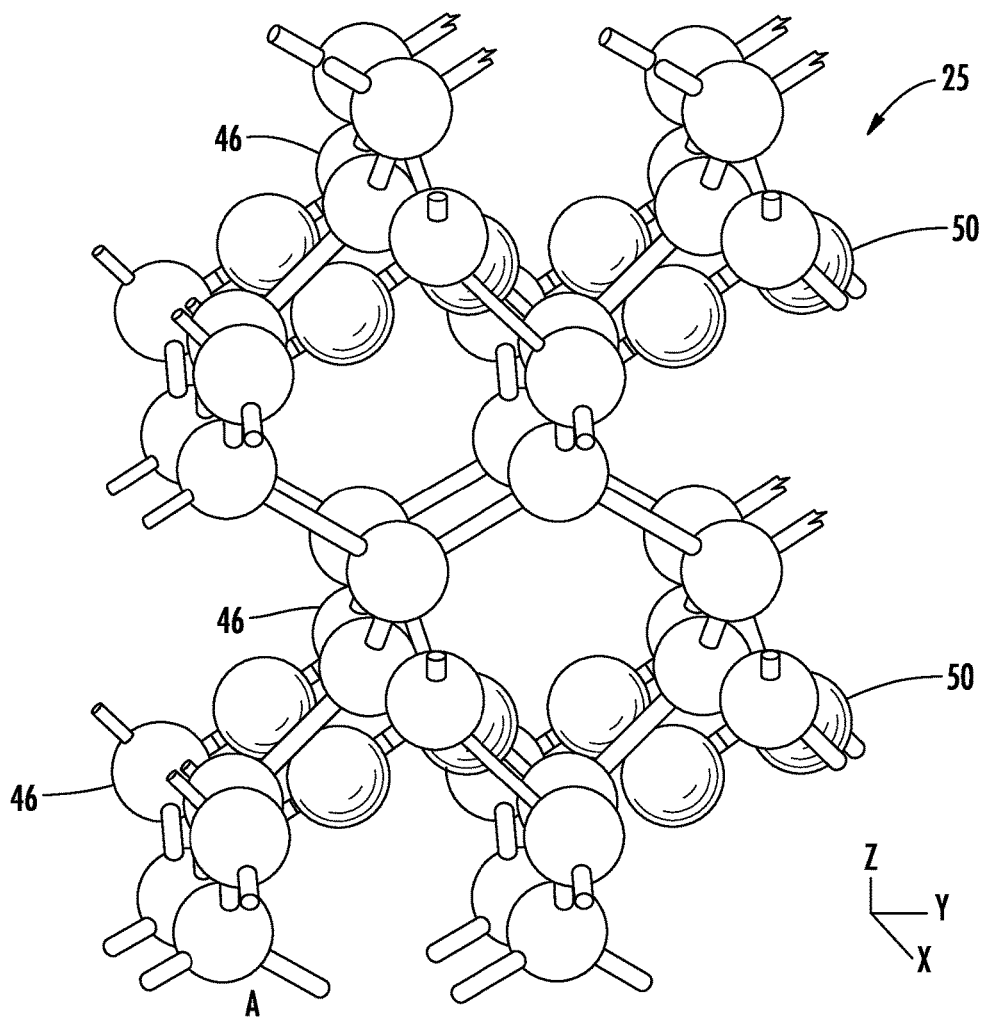
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer

50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
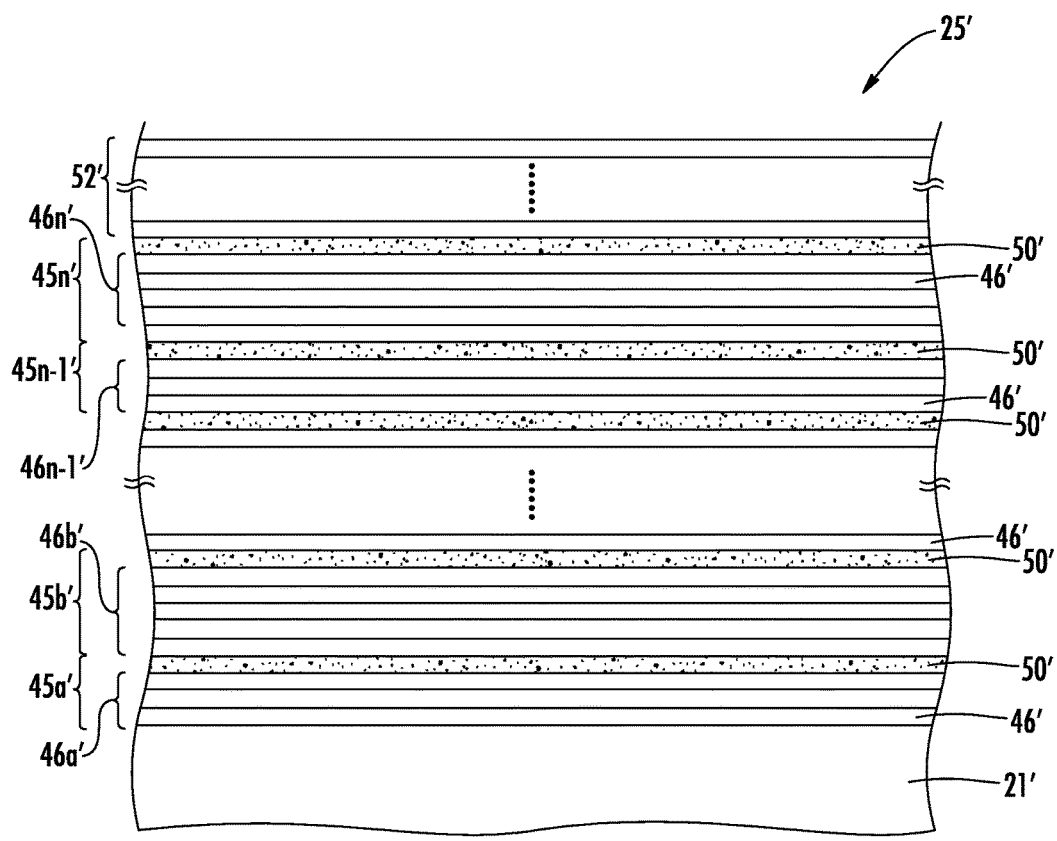
FIG. 3 is a greatly enlarged schematic cross-sectional view of another embodiment of a superlattice in accordance with the invention.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
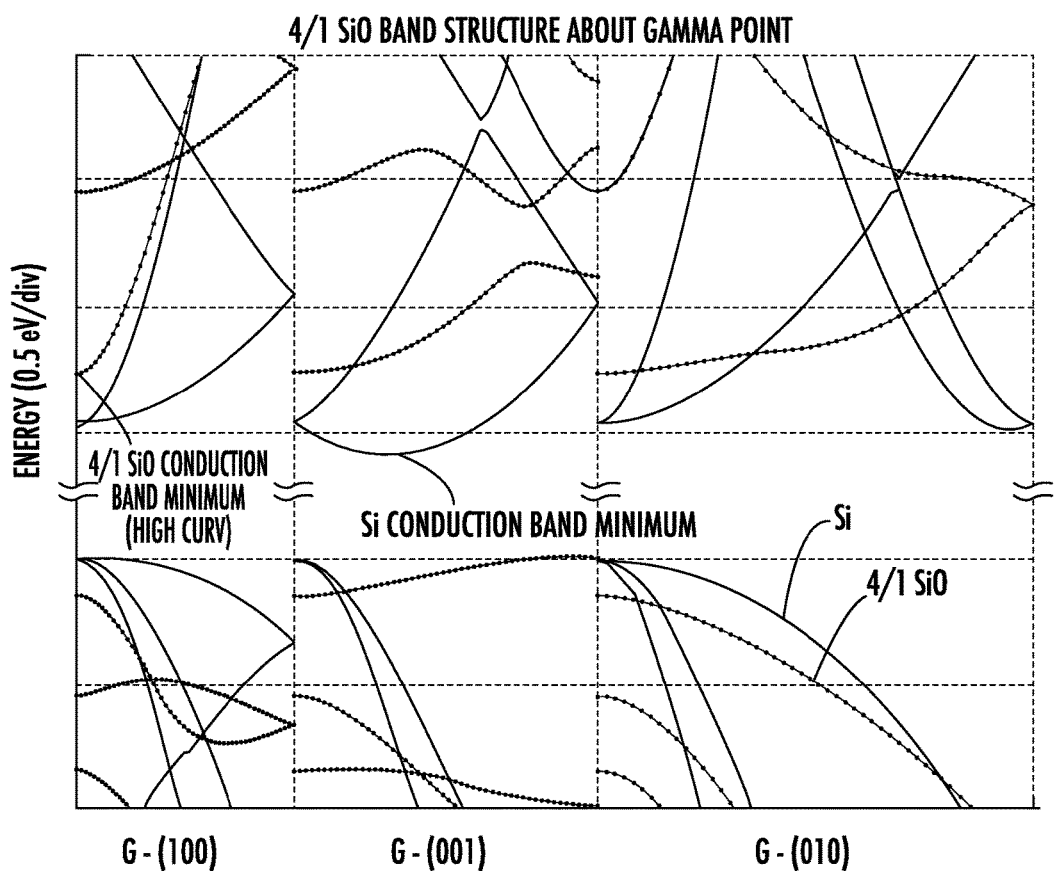
FIG. 4A is a graph of the calculated band structure from the gamma point (G) for both bulk silicon as in the prior art, and for the 4/1 Si/O superlattice as shown in FIGS. 1-2.
Figure 4B:
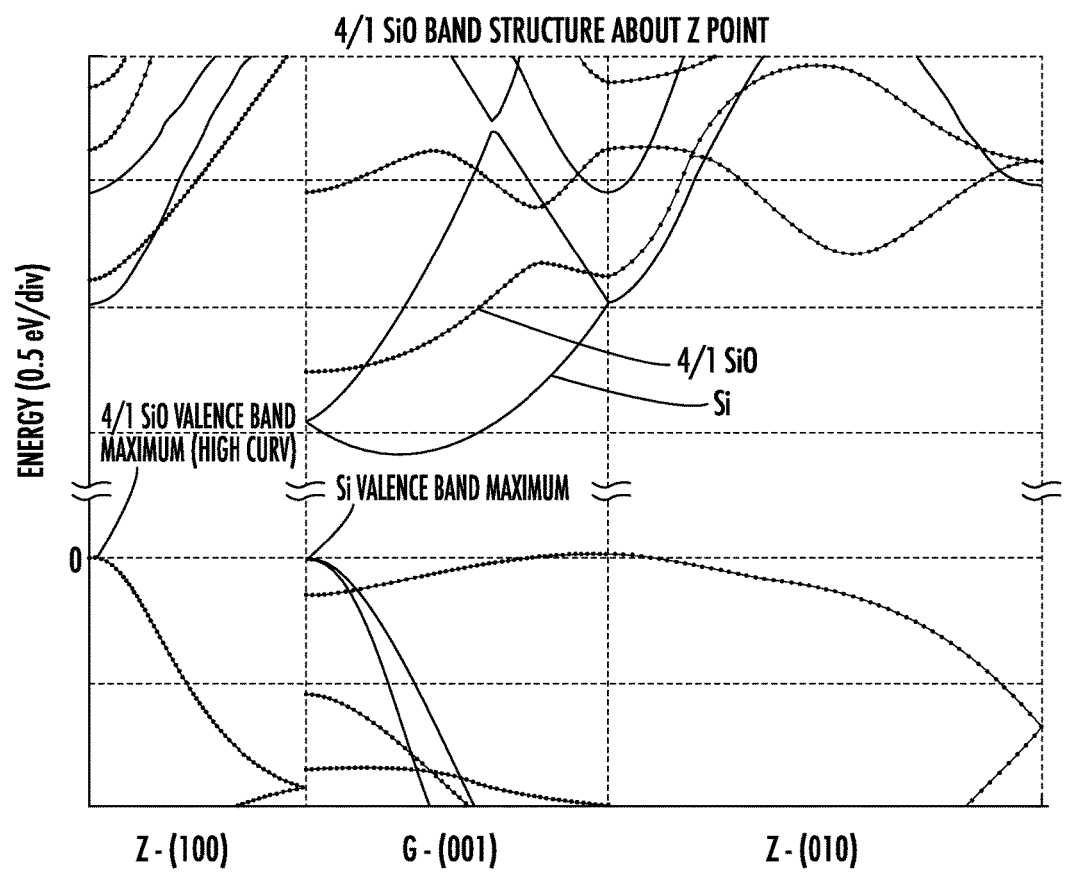
FIG. 4B is a graph of the calculated band structure from the Z point for both bulk silicon as in the prior art, and for the 4/1 Si/O superlattice as shown in FIGS. 1-2.
Figure 4C:
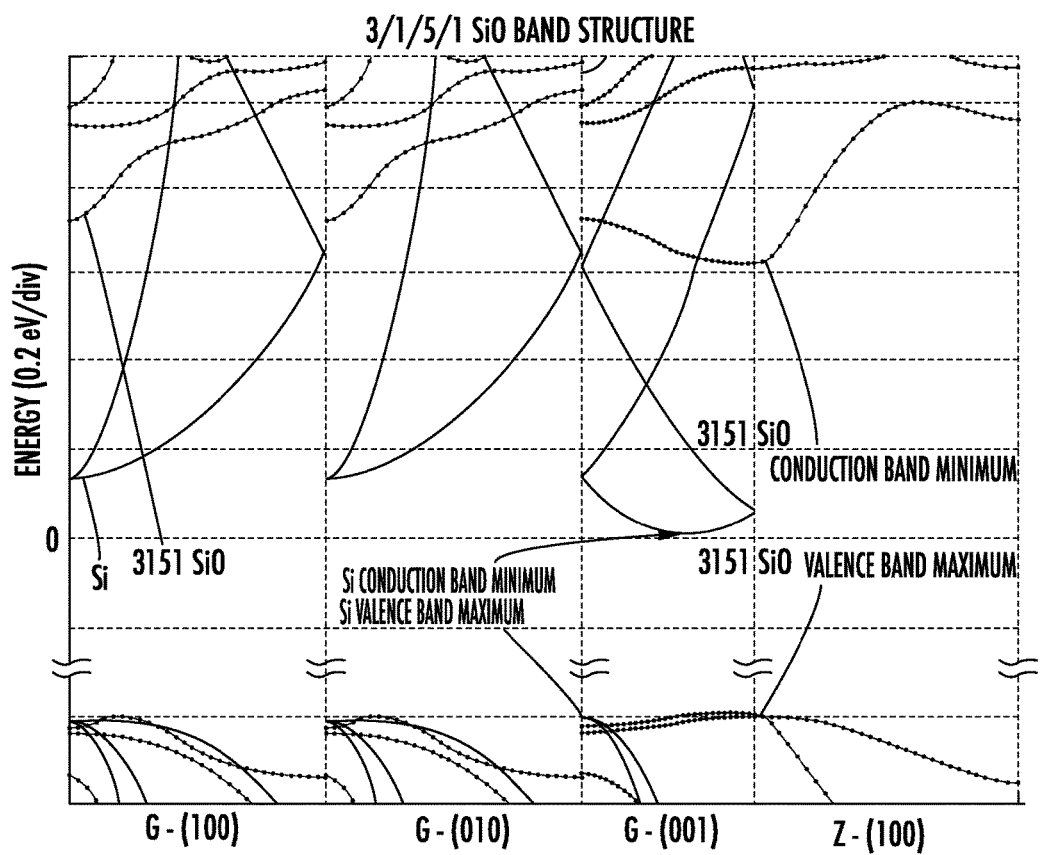
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
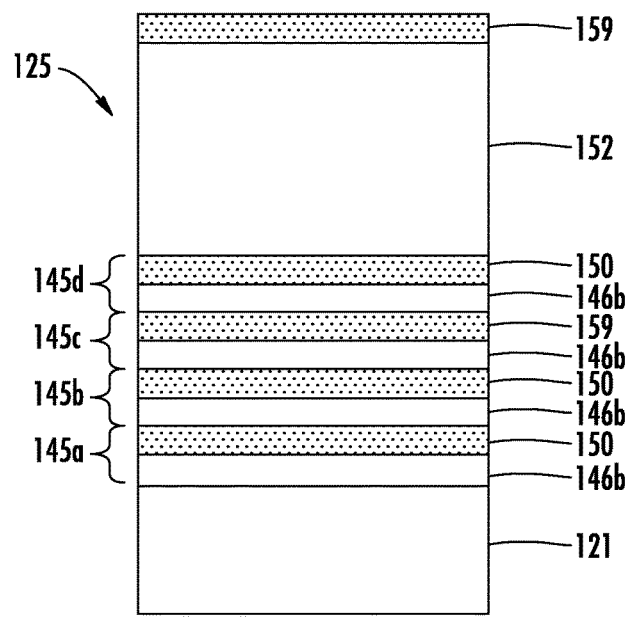
FIGS. 5 and 6 are schematic cross-sectional diagrams illustrating a method for making a semiconductor device with a buried insulating layer in accordance with an example embodiment.
Figure 6:
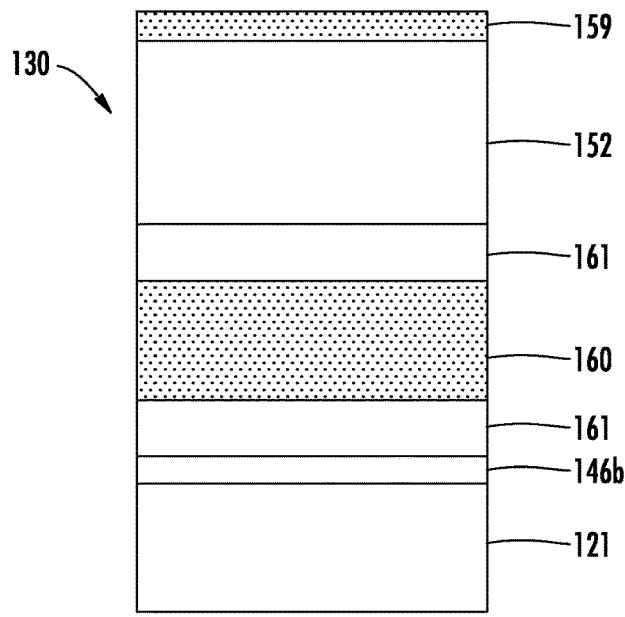
Figure 7:
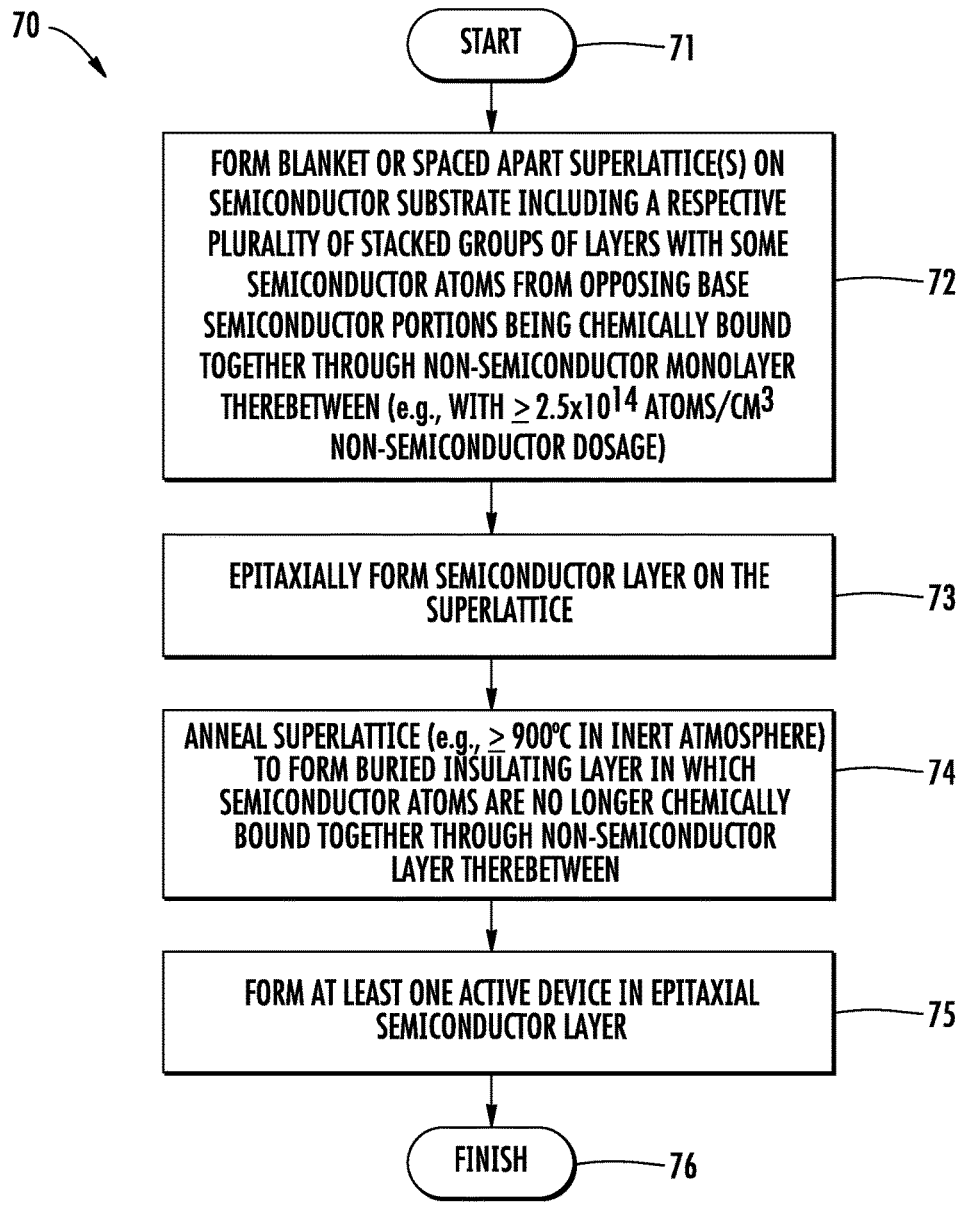
FIG. 7 is a flow diagram of a method for making a semiconductor device with a buried insulating layer in accordance with an example embodiment.

Turning to FIGS. 5-6 and the flow diagram 200 of FIG. 7, an example method for making a semiconductor device 130 using the above-described techniques is now described. By way of background, currently silicon on insulator (SOI), silicon on sapphire (SOS), and strained silicon on insulator (sSOI) approaches have many process variations. Separation by implantation of oxygen (SIMOX), or silicon wafer bonding is where a single crystal silicon wafer (handle) is bonded to a second wafer that has an $SiO_2$ surface with a high stress hydrogen or helium implanted region within the single crystal silicon under the $SiO_2$ surface layer. The top portion (several Angstroms) of the oxidized and implanted silicon wafer is separated from its original wafer, along the stressed hydrogen or helium implant region. The exfoliated silicon becomes the top surface of the handle wafer. The SOI wafers have an advantage over bulk silicon wafers in that the devices built on SOI are better isolated from neighboring devices and the subsurface of the wafer bulk. This reduces parasitic performance losses in the transistors that will be implemented on the SOI wafers.

However, current SOI technologies are relatively expensive as they require extra fabrication steps, and extra wafers are necessary to form the final SOI substrate in some cases. Furthermore, SIMOX requires a relatively expensive high energy implant that causes a significant amount of damage to the silicon lattice, which requires a high temperature anneal to reconstruct the lattice. The wafer bonding approach requires an extra wafer and a chemical mechanical polishing (CMP) step to smooth the rough surface that results from the splitting process. Moreover, these SOI techniques may only be applied on a global scale, that is, the entire wafer is either SOT or not.

Beginning at Block 71, a superlattice 125 similar to those discussed above is formed on a semiconductor (e.g., silicon) substrate 121. As discussed further above, the superlattice 125 illustratively includes a respective plurality of stacked groups of layers 145a-145d, although different numbers of groups may be used in different embodiments as previously mentioned. Each group of layers 145a-145d illustratively includes a plurality of stacked base semiconductor (e.g., silicon) monolayers defining a base semiconductor portion 146b, and one or more non-semiconductor (e.g., oxygen) monolayers 150 constrained within a crystal lattice of adjacent base semiconductor portions. Again, at least some semiconductor atoms from opposing base semiconductor portions 46b are chemically bound together through the non-semiconductor monolayer(s) 150 therebetween, as explained above.

It should be noted that the superlattice 125 may be a plurality of laterally spaced apart superlattices selectively formed on the semiconductor substrate 121. That is, by using a selective epitaxial superlattice growth process, localized regions of SOI may be formed on a wafer, as opposed to having SOI across an entire wafer as is done with current SOI technologies. However, the superlattice 125 may also be formed as a continuous superlattice across the entire semiconductor substrate 121, if desired.

The method further illustratively includes epitaxially forming a semiconductor layer 152 (e.g., a silicon cap layer) on the superlattice 125. The epitaxial semiconductor layer 152 may be used as the active device layer for forming additional circuitry/devices during later processing steps. A native silicon oxide layer 159 may also be formed after the epitaxial deposition of the semiconductor layer 152.

In accordance with an example aspect, the superlattice 125 may advantageously be annealed so that the non-semiconductor (e.g., oxygen) atoms of the non-semiconductor monolayers 150 relocate to form an insulating layer 160 through which the semiconductor atoms which were previously chemically bound together through the non-semiconductor monolayer(s) therebetween are no longer chemically bound together, as will be discussed further below.

More particularly, the buried insulating layer 160 provides a relatively thin insulating layer between the substrate 121 and the epitaxial semiconductor layer 152, which will remain single crystalline after wafer processing. For this application, using silicon as the semiconductor material and oxygen as the non-semiconductor material, for example, the inserted oxygen dosage used for forming the monolayers 150, as well as the spacing between groups of silicon monolayers 146b, may be optimized for forming SOI versus mobility enhancement (i.e., less space and a higher percentage of oxygen for SOI applications), as discussed further below.

The example method advantageously builds on the ability described above to add oxygen monolayers to a silicon lattice without disrupting the epitaxial silicon order. By way of example, the oxygen dosage for this SOI application may be higher than $2.5 \times 10^{14}$ atoms/cm$^3$ to provide the buried insulating layer 160. Generally speaking, it may be desirable to use the highest oxygen dosage possible without destroying the silicon lattice (i.e., without forming SiO$_2$ during the superlattice deposition). That is, a dosage of $\sim 2.5 \times 10^{14}$ atoms/cm$^3$ or less may be used for mobility enhancing applications as described above, but in the present SOI implementation a higher oxygen atom concentration or coverage in the monolayers 150 may be desirable.

With respect to the spacing between the inserted oxygen monolayers, in a typical mobility enhancing configuration the superlattice may have a spacing of approximately 16 Å. For the present SOI application, the desired spacing would be less than 16 Å, although a wider spacing (e.g., up to about 25 Å may be used in other embodiments). Generally speaking, the thickness of the silicon monolayer groups 146b should be as thin as possible without introducing defects in the silicon crystal lattice.

By way of example, the annealing may be performed at approximately 750° C. or higher in an inert atmosphere (e.g., N$_2$, Ar, He, etc.), and more preferably in a range of about 800° C. to 1000° C. In some embodiments non-inert atmospheres (e.g., H$_2$) may also be used depending on the temperature range being used, for example. The annealing causes the inserted oxygen monolayers 150 to decompose spinodally. That is, the oxygen atoms will diffuse together to form the oxide insulating layer 160 with a higher oxygen concentration, and with a denuded single crystal silicon region 161 on either side of the newly formed insulator. It will be appreciated that the exemplary annealing times, temperatures, and environments, as well as the dosages and spacings noted above, may be varied depending upon the particular application and materials being used.

As noted above, additional processing steps may be performed to form active semiconductor devices (transistors, diodes, etc.) in or on the epitaxial semiconductor layer 152 to provide the end semiconductor device 130, at Block 75. In other applications, the semiconductor device 130 may be a semiconductor wafer that is fabricated by one manufacturer and used by another manufacturer to perform the subsequent circuit fabrication, as will be appreciated by those skilled in the art. The method of FIG. 7 illustratively concludes at Block 76.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor wafer comprising:
   forming a superlattice on a semiconductor substrate comprising a respective plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions, with at least some semiconductor atoms from opposing base semiconductor portions being chemically bound together through the at least one non-semiconductor monolayer therebetween;
   epitaxially forming a semiconductor layer on the superlattice; and
   annealing the superlattice so that the non-semiconductor monolayers relocate to form a buried insulating layer in which the at least some semiconductor atoms are no longer chemically bound together through the at least one non-semiconductor monolayer therebetween.

2. The method of claim 1 further comprising forming at least one active semiconductor device in the epitaxially formed semiconductor layer.

3. The method of claim 1 wherein annealing comprises annealing the superlattice at a temperature in a range of 800° C. to 1000° C.

4. The method of claim 1 wherein annealing comprises annealing the superlattice in an inert atmosphere.

5. The method of claim 1 wherein forming the at least one non-semiconductor monolayer comprises forming the at least one non-semiconductor layer with a dosage of at least $2.5 \times 10^{14}$ atoms/cm$^3$.

6. The method of claim 1 wherein forming the superlattice comprises forming the superlattice with a spacing of less than 16 Å between non-semiconductor monolayers of adjacent groups of layers.

7. The method of claim 1 wherein forming the superlattice comprises selectively forming a plurality of spaced apart superlattices on the semiconductor substrate.

8. The method of claim 1 wherein forming the superlattice comprises forming a continuous superlattice across the semiconductor substrate.

9. The method of claim 1 wherein the at least one non-semiconductor monolayer comprises oxygen.

10. The method of claim 1 wherein the semiconductor monolayers comprise silicon.

11. The method of claim 1 wherein the semiconductor layers comprise germanium.

12. A method for making a semiconductor wafer comprising:
selectively forming a plurality of spaced apart superlattices on a semiconductor substrate and each comprising a respective plurality of stacked groups of layers, each group of layers comprising a plurality of stacked base silicon monolayers defining a base silicon portion, and at least one oxygen monolayer constrained within a crystal lattice of adjacent base silicon portions, with at least some silicon atoms from opposing base silicon portions being chemically bound together through the at least one oxygen monolayer therebetween;
epitaxially forming a semiconductor layer on the superlattice; and
annealing the superlattice so that the non-semiconductor monolayers relocate to form a buried insulating layer in which the at least some silicon atoms are no longer chemically bound together through the at least one oxygen monolayer therebetween.

13. The method of claim 12 further comprising forming at least one active semiconductor device in the epitaxially formed semiconductor layer.

14. The method of claim 12 wherein annealing comprises annealing the superlattice at a temperature in a range of 800° C. to 1000° C.

15. The method of claim 12 wherein annealing comprises annealing the superlattice in an inert atmosphere.

16. The method of claim 12 wherein forming the at least one oxygen monolayer comprises forming the at least one oxygen monolayer with a dosage of at least $2.5 \times 10^{14}$ atoms/$cm^3$.

17. The method of claim 12 wherein forming the superlattice comprises forming the superlattice with a spacing of less than or equal to 16 Å between oxygen monolayers of adjacent groups of layers.

18. A method for making a semiconductor wafer comprising:
forming a continuous superlattice across a semiconductor substrate, the superlattice comprising a plurality of stacked groups of layers, each group of layers comprising a plurality of stacked base silicon monolayers defining a base silicon portion, and at least one oxygen monolayer constrained within a crystal lattice of adjacent base silicon portions, with at least some silicon atoms from opposing base silicon portions being chemically bound together through the at least one oxygen monolayer therebetween;
epitaxially forming a semiconductor layer on the superlattice; and
annealing the superlattice so that the non-semiconductor monolayers relocate to form a buried insulating layer in which the at least some silicon atoms are no longer chemically bound together through the at least one oxygen monolayer therebetween.

19. The method of claim 18 further comprising forming at least one active semiconductor device in the epitaxially formed semiconductor layer.

20. The method of claim 18 wherein annealing comprises annealing the superlattice at a temperature in a range of 800° C. to 1000° C.

21. The method of claim 18 wherein annealing comprises annealing the superlattice in an inert atmosphere.

22. The method of claim 18 wherein forming the at least one oxygen monolayer comprises forming the at least one oxygen monolayer with a dosage of at least $2.5 \times 10^{14}$ atoms/$cm^3$.

23. The method of claim 18 wherein forming the superlattice comprises forming the superlattice with a spacing of less than 16 Å between oxygen monolayers of adjacent groups of layers.

\* \* \* \* \*

UNITED STATES PATENT AND TRADEMARK OFFICE
CERTIFICATE OF CORRECTION

PATENT NO. : 10,109,479 B1  
APPLICATION NO. : 15/664028  
DATED : October 23, 2018  
INVENTOR(S) : Mears et al.

Page 1 of 1

It is certified that error appears in the above-identified patent and that said Letters Patent is hereby corrected as shown below:

In the Drawings

Delete: FIG. 5  
Insert: New FIG. 5 as shown below:

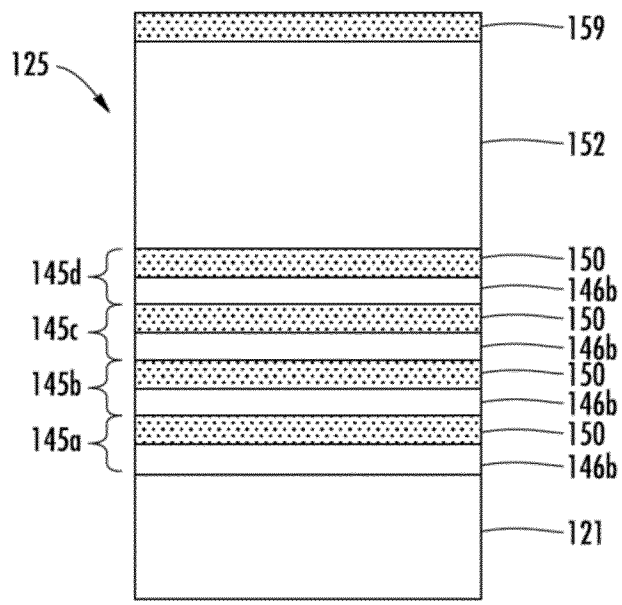

Signed and Sealed this  
Eighth Day of February, 2022

Drew Hirshfeld  
*Performing the Functions and Duties of the*  
*Under Secretary of Commerce for Intellectual Property and*  
*Director of the United States Patent and Trademark Office*